United States Patent [19]

Vassilev et al.

[11] Patent Number: 4,494,078

[45] Date of Patent: Jan. 15, 1985

[54] CLASS BC POWER AMPLIFIER

[75] Inventors: Vassil B. Vassilev; Vassil M. Sofiyanski, both of Sofia, Bulgaria

[73] Assignee: V M E I "Lenin", Sofia, Bulgaria

[21] Appl. No.: 258,808

[22] Filed: Apr. 29, 1981

[30] Foreign Application Priority Data

Apr. 29, 1980 [BG] Bulgaria .................................. 47571

[51] Int. Cl.$^3$ .............................................. H03F 3/30
[52] U.S. Cl. .................................... 330/297; 330/263
[58] Field of Search ......................... 330/263, 267, 297

[56] References Cited

U.S. PATENT DOCUMENTS 3,319,175 5/1967 Dryden ........................... 330/263 X

FOREIGN PATENT DOCUMENTS 53-7160 1/1978 Japan .................................. 330/297

OTHER PUBLICATIONS

Feldman, "Class G High Efficiency Hi-Fi Amplifier", Radio-Electronics, Aug. 1976, pp. 47-49, 87.

Primary Examiner—James B. Mullins

[57] ABSTRACT

A class BC power amplifier having a symmetrical push-pull preamplifier and a pair of symmetrical branches coupled, respectively, to the outputs of said push-pull preamplifier. Each of said branches includes a first power stage, operating in class B, coupled to the output of said branch, a control stage coupled to the respective output of said push-pull preamplifier for controlling said first power stage, a second power stage, operating in class C, coupled to said first power stage, and a first comparative stage coupled between said control stage and said branch output for controlling said second power stage. Each branch of said power amplifier further comprises a third power stage, operating in class C, also coupled to said first power stage, and a second comparative stage coupled between said control stage and said branch output for controlling said third power stage.

18 Claims, 2 Drawing Figures

CLASS BC POWER AMPLIFIER

BACKGROUND OF THE INVENTION

This invention relates to a class BC power amplifier which can be used in amplifying devices for which a minimum volume and a low weight, prime cost and electric energy consumption per unit useful power are of primary importance. Such are, for example, the amplifying devices for installations of wired radio units in which the use of an output transformer is obligatory, orchestra amplifiers which may be without output transformer (transformer-less circuit), portable devices comprising low-frequency amplifiers, etc.

A known class BC power ampifier is built on the basis of a push-pull circuit. It comprises a symmetrical push-pull preamplifier, the two outputs of which are connected to the two branches of the amplifier, the one branch being connected to the positive poles of a pair of supply sources, while the other branch is connected to the negative poles of the supply sources, both branches being completely symmetrical, respective transistors having opposite conductivity. The one output of the symmetrical push-pull preamplifier is connected to the base of a saturated n-p-n transistor whose collector is connected, by means of a commutating diode, in pass direction with respect to its collector current, to the positive pole of a low-voltage supply source with a grounded center point. The emitter of the saturated transistor is connected through a series combination of an emitter resistor for the saturated transistor and an emitter resistor for a comparative transistor, to ground. The emitter of the saturated transistor also is connected directly to the base of a p-n-p transistor of the power stage operating in class B, whose emitter is both connected to the collector of the saturated n-p-n transistor and to the collector of a p-n-p transistor of the power stage operating in class C, whose emitter is connected directly to the positive pole of a high-voltage supply source with a grounded center point. The collector of the p-n-p transistor of the power stage operating in class B is connected through the load to ground and, by means of a protective diode in pass direction with respect to the base current, to the base of the comparative transistor, whose emitter is connected to the common point of the emitter resistors for the saturated and the comparative transistors, while the collector of the comparative transistor is connected directly to the base of the p-n-p transistor of the power stage operating in class C.

When a signal is received in the input of the amplifier with a level up to about the ratio of the low-voltage to the high-voltage source multiplied by the nominal input level, only the class B amplifier is actuated which is supplied by the low-voltage source. With the increase of the momentary value of the input signal above the aforementioned level, there are created conditions for rendering conductive the corresponding transistor of the amplifier operating in class C, which is supplied by the high-voltage source. The collector current of the transistors closes its circuit through the load to ground.

A drawback of the aforedescribed circuit lies in that the efficiency in the whole amplitude range and particularly in the case of weaker signals is relatively low.

There are also known other class BC power amplifiers in which the commutation is effected by Zener diode. Their drawback lies in that in the vicinity of the interval of commutation of the sources, the efficiency is considerably lowered.

SUMMARY OF THE INVENTION

It is therefore a general object of the invention to provide a class BC power amplifier which operates at a higher efficiency and allows the use of an output transformer, which does not require the complication of nor the rendering more expensive, respectively, of the circuit of the current rectifier and its filter.

This object is achieved by a class BC power amplifier which is built on the basis of a push-pull circuit. It comprises a symmetrical push-pull preamplifier, the two outputs of which are connected respectively to both branches of the amplifier, the one branch being connected to the positive poles of a pair of supply sources, while the other branch is connected to the negative poles. Both branches are completely symmetrical, respective transistors having opposite conductivities. The one output of the symmetrical push-pull preamplifier is connected to the base of a saturated n-p-n transistor, whose collector is connected, by means of a commutating diode in pass direction with respect to the transistor collector current, with ground. The emitter of the saturated transistor is connected through a series combination, including an emitter resistor for the saturated transistor and emitter resistor for a comparative transistor, to one of the supply sources. The emitter of the saturated transistor is also connected directly to the base of a p-n-p transistor of the power stage operating in class B, whose emitter is connected to the collector of the saturated n-p-n transistor and to the collector of a p-n-p transistor of the power stage operating in class C, whose emitter is connected directly to the positive pole of a low-voltage supply source with grounded center point. The collector of the p-n-p transistor of the power stage operating in class B is connected to the active end of the load and, by means of a protective diode in pass direction with respect to the base current, to the base of the comparative transistor, whose emitter is connected to the common point of the emitter resistors for the saturated and the comparative transistors, while its collector is connected to the base of a p-n-p transistor of the power stage operating in class C. Between the emitter resistors for the saturated and for the comparative transistors, there is also provided an emitter resistor for a second comparative transistor, whose base is connected, by means of a protective diode included in the pass direction with respect to the base current, to the active end of the load, while its collector is connected directly to the base of a second p-n-p transistor of the power stage operating in class C. Its emitter is connected to the positive pole of the low-voltage supply source, while its collector is connected to the cathode of the commutating diode whose anode is grounded. The cathode of the commutating diode is also connected to the cathode of a second commutating diode, whose anode is connected to the collector of the p-n-p transistor of the power stage operating in class C. The base of the latter is connected to the anode of a third protective diode, whose cathode is connected to the collector of a comparative transistor. The pole, to which the emitter resistor for the comparative transistor is connected, is the negative pole of the low-voltage supply source. The load is connected to the outputs of both branches by means of the secondary winding of a three-winding output transformer, of which the starting ends of both primary windings are connected to the branches, while their opposite ends are connected to the respective poles of the low-voltage supply source with grounded center point.

In addition to the aforedescribed manner, the amplifier allows (if this is appropriate) the connection of the load directly (without output transformer) to the output of the amplifier. In this case the collectors of the transistors operating in class B are short-circuited, while the outputs of both branches are commoned and connected to one end of the load, the other end of the load being grounded. At that, the emitter of the p-n-p transistor of the power stage operating in class B is connected to the cathode of the commutating diode whose anode is connected to the positive pole of a third supply source with grounded center point, while the pole, to which the emitter resistor for the comparative transistor is connected, is grounded.

The advantages of the disclosed class BC power amplifier lie in that it operates at a considerably higher efficiency and without the use of an output transformer, and does not require a complication of or rendering more expensive, respectively, the current rectifier and its filter.

DESCRIPTION OF THE DRAWINGS

For better understanding of the invention, reference should be made to the accompanying drawings in which there is illustrated and described a preferred embodiment of the invention with output transformer. In the drawings.

DESCRIPTION OF THE PREFERRED EMBODIMENT

Figure 1:
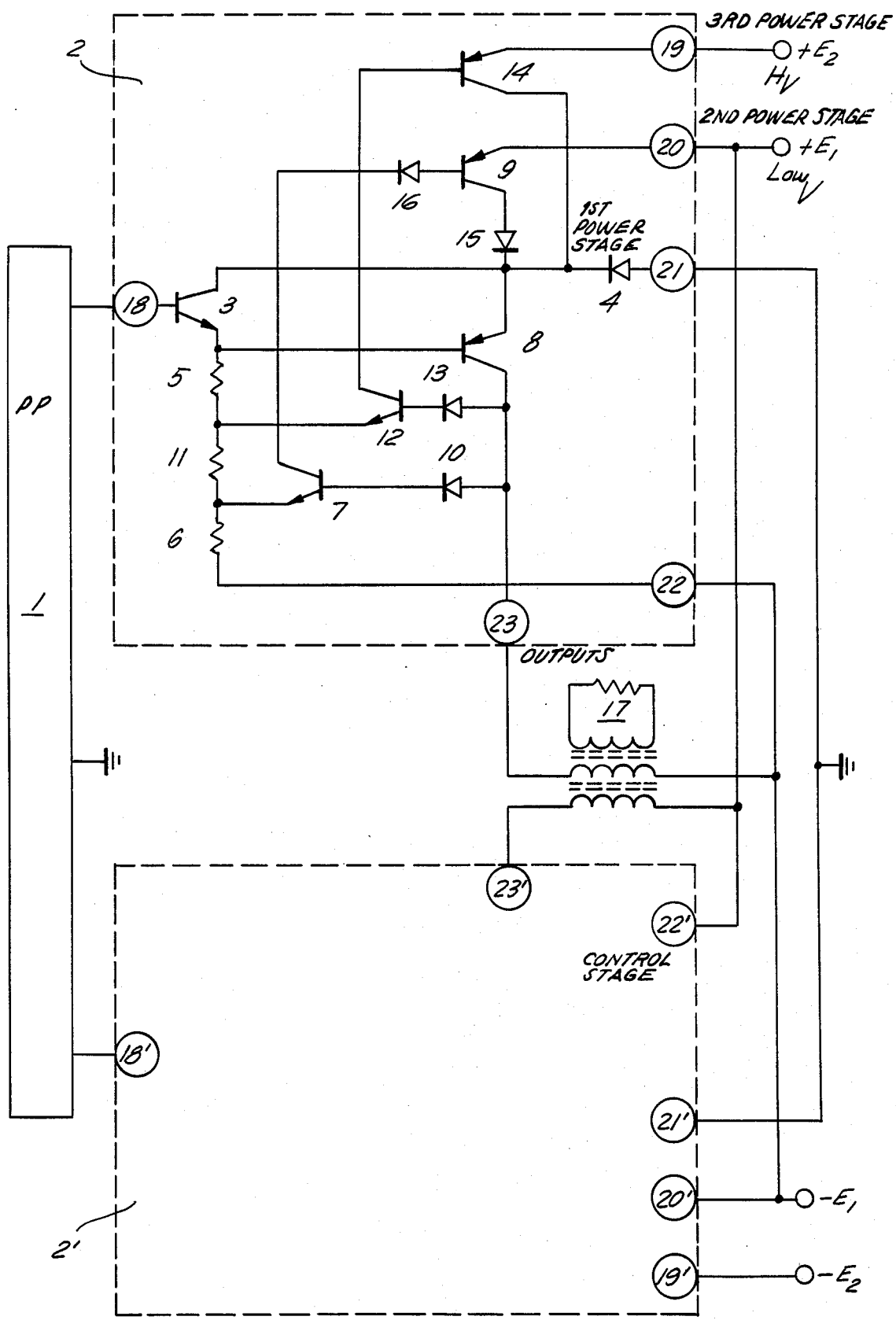
FIG. 1 shows in principle the circuit of an amplifier with direct-connection of the load.

The class BC power amplifier shown in FIG. 1 is built on a push-pull principle and comprises a symmetrical push-pull preamplifier 1, whose two outputs are connected to both branches of the amplifier. One of the branches 2 is connected to the positive poles of a pair of supply sources $+E_1$ and $+E_2$, while the other branch 2' is connected to the negative poles of the supply sources $-E_1$ and $-E_2$. Both branches 2 and 2' are completely symmetrical, respective transistors having opposite conductivities. One of the outputs of the symmetrical push-pull preamplifier 1 is connected, in one of the branches, to the base of a saturated n-p-n transistor 3, whose collector is connected, through a commutating diode 4 in pass direction with respect to transistor 3 collector current, with ground. The emitter of the saturated transistor 3 is connected through a series combination, including an emitter resistor 5 for the saturated transistor 3 and an emitter resistor 6 for a comparative transistor 7, to the supply source. The emitter of the saturated transistor 3 is further connected directly to the base of a p-n-p transistor 8 of the power stage, operating in class B, the emitter of which is connected to the collector of the saturated n-p-n transistor 3 and to the collector of a p-n-p transistor 9 of the power stage, via a second commutating diode 15 in pass direction with respect to the transistor 9 collector current, operating in class C, whose emitter is connected directly to the positive pole $+E_1$ of the low-voltage supply source with grounded center point. The collector of p-n-p transistor 8 is connected to the active end of the load and, through a protective diode 10, in pass direction with respect to the transistor 7 base current, to the base of the comparative transistor 7, whose emitter is coupled between the emitter resistors 5 and 6 for the saturated 3 and the comparative 7 transistors, respectively. The collector of the transistor 7 is connected, via a protective diode 16 in pass direction with respect to the transistor 9 base current, to the base of the p-n-p transistor 9.

Between the emitter resistors 5 and 6 of the saturated 3 and the comparative 7 transistors, respectively, there is included an emitter resistor 11 for a second comparative transistor 12, whose base is connected, through a protective diode 13 in pass direction with respect to the transistor 12 base current, to the active end of the load. The collector of comparative transistor 12 is connected directly to the base of a second p-n-p transistor 14 of the power stage operating in Class C, the emitter of which being connected to the positive pole $+E_2$ of the high-voltage supply source. The collector of the transistor 14 is connected to the cathode of the commutating diode 4, whose anode is grounded. The pole to which the emitter resistor 6, for the comparative transistor 7, is connected, is the negative pole $-E_1$ of the low-voltage supply source. The load is connected to the amplifier through the secondary winding of a three-winding output transformer 17 (see FIG. 2), of which the starting ends of the primary windings are connected to both outputs of the branches 23 and 23', the opposite ends of which being connected to the respective poles $-E_1$, $E_1$ of the low-voltage supply source with grounded center point.

Figure 2:
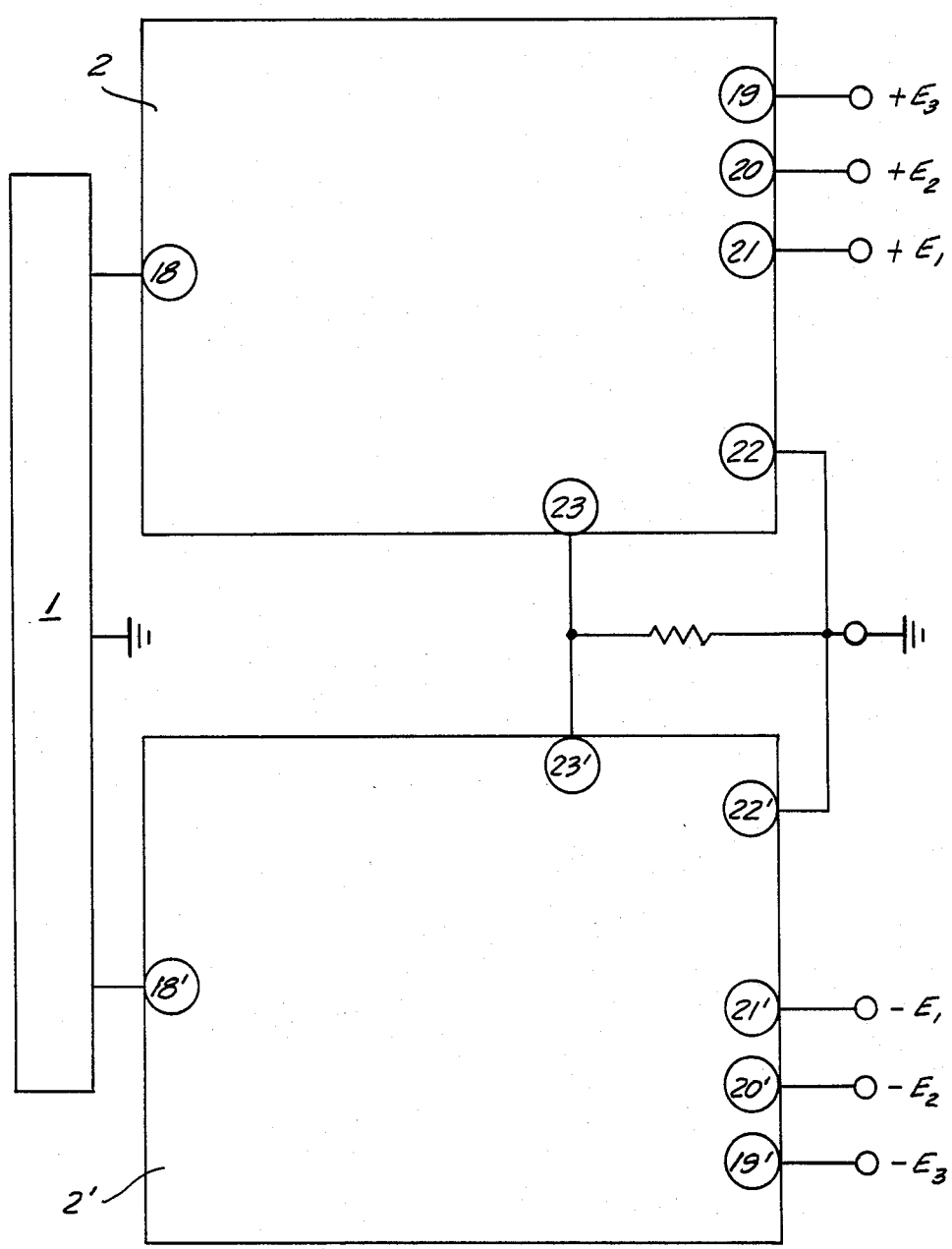
FIG. 2 shows in principle the circuit of an amplifier with transformer connection of the load.

FIG. 2 shows another embodiment of the invention in which there is no output transformer, but the number of supply sources with grounded center point is three instead of two. In it, both outputs of the branches are commoned and directly connected to the load; while the other end of the load is grounded. At that, the emitter of the p-n-p transistor of the power stage operating in class B is connected to the cathode of the commutating diode, whose anode is connected to the positive pole of a third supply source with grounded center point, while the pole to which the emitter resistor 6 of the comparative transistor 7 is grounded.

The operation of the class BC power amplifier is based on the special manner of connecting the aforedescribed components and is characterized by the following features:

At rest, there is established, through the saturated transistors, a current of rest, close to the maximum value of the base current of the transistors 8 and 8' of the power stage operating in class B, the transistors 3 and 3' being in a condition close to saturation. When a signal is received, depending on its polarity, the current of one of the transistors 3 and 3' is reduced, thus rendering conductive its respective transistor of the power stage operating in class B, transistors 8 for example. Energy is consumed only by the low-voltage source between ground and its negative pole. With the increase of the signal, transistor 9 of the power stage is actuated which operates in class C. Energy is consumed between the positive and negative poles of the low-voltage source, i.e. the equivalent voltage is 2E. A further increase of the signal renders conducting the second transistor 14 of the power stage operating in class C condition. The voltage of the equivalent source is three times higher (3E).

What is claimed is:

1. A class BC power amplifier having a symmetrical push-pull preamplifier and a pair of symmetrical branches coupled, respectively, to the outputs of said push-pull preamplifier, each of said branches including a first power stage, operating in class B, coupled to the output of said branch, a control stage coupled to the respective output of said push-pull preamplifier for controlling said first power stage, a second power stage, operating in class C, coupled to said first power stage, and a first comparative stage coupled between said control stage and said branch output for controlling said second power stage, characterized in that each branch of said power amplifier further comprises a third power stage, operating in class C, also coupled to said first power stage, and a second comparative stage coupled between said control stage and said branch output for controlling said third power stage; a low voltage supply source and high voltage supply source, each of said supply sources having a grounded center point and a positive and a negative pole, the positive pole of said low voltage supply source being coupled to said second power stage of one of said branches and to the control stage of the other of said branches, the negative pole of said low voltage supply source being coupled, conversely, to the control stage of said one branch and to the second power stage of said other branch, and the positive and negative poles of said high voltage supply source being coupled respectively, to the third power stages of said one and said other branches.

2. A class BC power amplifier as claimed in claim 1, wherein, in each of said branches, said control stage is a transistor, the base of which being connected to the output of the push-pull preamplifier, the collector being connected to the first power stage and coupled to ground, and the emitter being coupled to the respective pole of said low voltage supply source and also connected to said first power stage.

3. A class BC power amplifier as claimed in claim 2, wherein, in each of said branches, said first power stage comprises a transistor, the emitter of which being connected to the collector of said control stage transistor, the base being connected to the emitter of said control stage transistor, and the collector being connected to said branch output.

4. A class BC power amplifier as claimed in claim 3, wherein, in each of said branches, said first comparative stage comprises a transistor having an emitter coupled to the emitter of said control stage transistor, a base coupled to said branch output, and a collector coupled to said second power stage.

5. A class BC power amplifier as claimed in claim 4, wherein, in each of said branches, said second power stage comprises a transistor having a base coupled to the collector of said first comparative stage transistor, an emitter connected to the respective pole of said low voltage supply source, and a collector coupled to the emitter of said first power stage transistor.

6. A class BC power amplifier as claimed in claim 5, wherein, in each of said branches, said second comparative stage comprises a transistor having an emitter coupled to the emitter of said control stage transistor, a base coupled to said branch output, and a collector connected to said third power stage.

7. A class BC power amplifier as claimed in claim 6, wherein, in each of said branches, said third power stage comprises a transistor having a base connected to the collector of said second comparative stage transistor, an emitter connected to the respective pole of said high voltage supply source, and a collector connected to the emitter of said first power stage transistor.

8. A class BC power amplifier as claimed in claim 7, wherein the transistors in said one branch are of opposite conductivity than the respective transistors in said other branch.

9. A class BC power amplifier as claimed in claim 8, wherein, in said one branch, the transistors for the three power stages are p-n-p, while the transistors for the control stage and the two comparative stages are n-p-n.

10. A class BC power amplifier having a symmetrical push-pull preamplifier and a pair of symmetrical branches coupled, respectively, to the outputs of said push-pull preamplifier, each of said branches including a first power stage, operating in class B, coupled to the output of said branch, a control stage coupled to the respective output of said push-pull preamplifier for controlling said first power stage, a second power stage, operating in class C, coupled to said first power stage, and a first comparative stage coupled between said control stage and said branch output for controlling said second power stage, characterized in that each branch of said power amplifier further comprises a third power stage, operating in class C, also coupled to said first power stage, and a second comparative stage coupled between said control stage and said branch output for controlling said third power stage; a low voltage supply source, a high voltage supply source, and a third voltage supply source, each of said supply sources having a grounded center point and a positive and a negative pole, the positive pole of said low voltage supply source being coupled to said first power stage of one of said branches, the positive pole of said high voltage supply source being coupled to said second power stage of said one branch, and the positive pole of said third voltage supply source being coupled to the third power stage of said one branch, the negative poles of said voltage supply sources being coupled, conversely, to the to the respective power stages said other branch, and the control stages of both branches being coupled to groung, whereby said power amplifier may be directly connected to a load without using an output transformer.

11. A class BC power amplifier as claimed in claim 10, wherein, in each of said branches, said control stage is a transistor, the base of which being connected to the output of the push-pull preamplifier, the collector being connected to the first power stage and coupled to ground, and the emitter being coupled to the respective pole of said low voltage supply source and also connected to said first power stage.

12. A class BC power amplifier as claimed in claim 11, wherein, in each of said branches, said branches, said first power stage comprises a transistor, the emitter of which being connected to the collector of said control stage transistor, the base being connected to the emitter of said control stage transistor, and the collector being connected to said branch output.

13. A class BC power amplifier as claimed in claim 12, wherein, in each of said branches, said first comparative stage comprises a transisror having an emitter coupled to the emitter of said control stage transistor, a base coupled to said branch output, and a collector coupled to said second power stage.

14. A class BC power amplifier as claimed in claim 13, wherein, in each of said branches, said second power stage comprises a transistor having a base coupled to the collector of said first comparative stage transistor, an emitter connected to the respective pole of said low voltage supply source, and a collector coupled to the emitter of said first power stage transistor.

15. A class BC power amplifier as claimed in claim 14, wherein, in each of said branches, said second comparative stage comprises a transistor having an emitter coupled to the emitter of said control stage transistor, a base coupled to said branch output, and a collector connected to said third power stage.

16. A class BC power amplifier as claimed in claim 15, wherein, in each of said branches, said third power stage comprises a transistor having a base connected to the collector of said second comparative stage transistor, an emitter connected to the respective pole of said high voltage supply source, and a collector connected to the emitter of said first power stage transistor.

17. A class BC power amplifier as claimed in claim 16, wherein the transistors in said one branch are of opposite conductivity than the respective transistors in said other branch.

18. A class BC power amplifier as claimed in claim 17, wherein, in said one branch, the transistors for the three power stages are p-n-p, while thr transistors for the control stage and the two comparative stages are n-p-n.

* * * * *